(12) United States Patent
Ootsuka et al.

(10) Patent No.: US 8,582,845 B2
(45) Date of Patent: Nov. 12, 2013

(54) MAGNETIC RESONANCE IMAGING APPARATUS AND METHOD OF COMPENSATION FOR READOUT GRADIENT MAGNETIC FIELD ERROR

(75) Inventors: Takehiro Ootsuka, Tokyo (JP); Masahiro Takizawa, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 208 days.

(21) Appl. No.: 13/140,860

(22) PCT Filed: Dec. 22, 2009

(86) PCT No.: PCT/JP2009/071290
§ 371 (c)(1),
(2), (4) Date: Jun. 20, 2011

(87) PCT Pub. No.: WO2010/074059
PCT Pub. Date: Jul. 1, 2010

(65) Prior Publication Data
US 2011/0249881 A1 Oct. 13, 2011

(30) Foreign Application Priority Data
Dec. 26, 2008 (JP) ................................. 2008-333812

(51) Int. Cl.
*G06K 9/00* (2006.01)
(52) U.S. Cl.
USPC ......................................................... 382/128
(58) Field of Classification Search
None
See application file for complete search history.

(56) References Cited

U.S. PATENT DOCUMENTS

| | | | | |
|---|---|---|---|---|
| 5,198,768 A | * | 3/1993 | Keren | 324/318 |
| 6,185,444 B1 | * | 2/2001 | Ackerman et al. | 600/410 |
| 6,566,878 B1 | * | 5/2003 | Komura et al. | 324/315 |

FOREIGN PATENT DOCUMENTS

WO   WO 2008/152937 A1   12/2008

OTHER PUBLICATIONS

International Search Report in PCT/JP2009/071290.
Lu, A., et al. (2006), "Improvements in R2 Mapping During In Vivo Cryoablation," Proceedings of the International Society for Magnetic Resonance in Medicine, p. 1424.

* cited by examiner

*Primary Examiner* — Stephen R Koziol
*Assistant Examiner* — Amandeep Saini
(74) *Attorney, Agent, or Firm* — Cooper & Dunham LLP (57) ABSTRACT

In nonlinear measurement in which a dephasing readout gradient magnetic field is not used, a positional shift of the k space data, which is caused by a difference between a readout gradient magnetic field actually applied and the calculated value, and a deterioration in the image quality resulting therefrom are reduced. In order to do so, in the invention, when executing an imaging pulse sequence including a nonlinear measurement which does not use a dephasing gradient magnetic field, a prescan sequence is executed and a correction value for correcting the shift of the readout gradient magnetic field from the set value is calculated from the data acquired in the prescan. When gridding the data acquired in the imaging pulse sequence, a parameter value of the gridding is corrected using the correction value to perform the gridding.

19 Claims, 10 Drawing Sheets

MAGNETIC RESONANCE IMAGING APPARATUS AND METHOD OF COMPENSATION FOR READOUT GRADIENT MAGNETIC FIELD ERROR

TECHNICAL FIELD

The present invention relates to a magnetic resonance imaging apparatus (hereinafter, referred to as an MRI apparatus) and in particular, to an MRI apparatus which realizes an imaging method of measuring a magnetic resonance signal from the rise time of a readout gradient magnetic field (nonlinear measurement).

BACKGROUND ART

As one of the high-speed imaging methods of the MRI apparatus, there is an imaging using a gradient echo method. In the pulse sequence of the gradient echo method, a high frequency magnetic field pulse for excitation is applied, and then a dephasing gradient magnetic field for diffusing the phase of the spin is applied in the reading direction before measuring a magnetic resonance signal. Then, a rephasing gradient magnetic field is applied to generate an echo. By measuring a signal for a predetermined sampling time while the rephasing gradient magnetic field is being applied, data before and after the peak of the signal including the peak can be acquired.

In the case of imaging using this gradient echo method, it is possible to shorten the imaging time significantly since an echo time TE (time for which the peak of a signal occurs) is short compared with a pulse sequence in a spin echo system in which a high frequency magnetic field pulse for spin inversion is used. However, since the application of the dephasing gradient magnetic field is essential, there is a limitation in shortening of the echo time TE.

On the other hand, a technique has been proposed which measures a signal within a shorter echo time by measuring a signal from rising of a gradient magnetic field without using a dephasing gradient magnetic field as a readout gradient magnetic field and using a half-wave high frequency magnetic field pulse as a high frequency magnetic field pulse which excites the spin (Patent Documents 1 and 2). This method is called a UTE measurement and can shorten the TE further. Accordingly, applications to imaging of a tissue with a short transverse relaxation time T2 which is difficult to image with a conventional MRI, for example, bone tissue and the like are expected.

In the UTE measurement, a radial scan is performed without using a phase encoding gradient magnetic field. In the radial scan, a plurality of signals is measured while changing the gradient magnetic field strength of a readout gradient magnetic field in each direction which is formed by gradient magnetic fields in two or three axial directions. The measurement data acquired in this way is arrayed radially from the origin of the k space since the measurement data is collected toward the base from the peak of the signal. In order to array the radial data in the grid of the k space, processing called gridding is necessary. The gridding is a processing of transforming the coordinates of measurement data, which is determined by the gradient magnetic field strength of the readout gradient magnetic field in each axial direction, into the coordinates of a grid point of the k space formed by a square or cubic lattice. By setting the measurement data acquired by nonlinear measurement as k space data by gridding, image reconstruction based on an operation, such as fast Fourier transform, becomes possible, for example.

In the gridding, the coordinates of raw measurement data are determined on the basis of the calculated value (application timing and strength of the gradient magnetic field set in the apparatus) of an applied gradient magnetic field. However, a gradient magnetic field actually applied deviates slightly from the calculated value of the gradient magnetic field due to the characteristics of a gradient magnetic field coil, shift of the control timing of an apparatus, and the like. For this reason, the k space data after gridding based on the calculated value includes an error, deteriorating the image quality when this is reconstructed.

The problem of gridding resulting from the difference between the set value (theoretical value) of the gradient magnetic field and the gradient magnetic field strength actually applied occurs not only in the UTE measurement but also in the radial scan. The inventor of this application proposes a method for solving this problem. This method is to calculate the shift amount for correcting the peak position (that is, a position which becomes the origin of the k space) of an echo signal using a plurality of echo signals.

CITATION LIST

[Patent Document 1] U.S. Pat. No. 5,025,216
[Patent Document 2] U.S. Pat. No. 5,150,053

SUMMARY OF INVENTION

Technical Problem

In the UTE measurement, however, a signal with no peak which starts from the origin of the k space coordinates is measured (sampling) instead of performing data measurement before and after the peak of a signal. Accordingly, even if the peak position is shifted, the peak position or a shift from the original position cannot be calculated from the shape of the signal.

Moreover, in the UTE measurement, the data acquired at equal distances on the time axis is not arrayed at equal distances on the k space coordinate axis because the measurement is performed from rising of the readout gradient magnetic field. Theoretically, gridding is performed at the positions arrayed at equal distances on the k space coordinate axis on the assumption that the shape is a trapezoid with a predetermined rising edge. However, since the shape or slope of rising deviates from the theoretical value, there is a problem that a difference occurs in gridding.

It is an object of the invention to provide an MRI apparatus capable of performing accurate gridding by solving the problem occurring in gridding of the measurement data in the UTE measurement described above.

Solution to Problem

In order to solve the above-described problem, in the invention, a correction value based on a difference between a set value of a readout gradient magnetic field in an imaging pulse sequence and an actual output value is calculated, and echo data acquired by the imaging pulse sequence is corrected or a readout gradient magnetic field in the imaging pulse sequence is corrected using the correction value.

Specifically, an MRI apparatus of the invention includes: a high frequency magnetic field generator; a gradient magnetic field generator; and a controller which controls measurement of a magnetic resonance signal by controlling the high frequency magnetic field generator and the gradient magnetic field generator. The controller has an imaging pulse sequence of measuring the magnetic resonance signal from a rising state of a readout gradient magnetic field and includes a correction value calculating unit that calculates a correction value based on a difference between a set value of the readout gradient magnetic field in the imaging pulse sequence and an actual output value. Moreover, using this correction value, the echo data acquired by the imaging pulse sequence is corrected or the readout gradient magnetic field in the imaging pulse sequence is corrected.

In addition, a readout gradient magnetic field error correcting method of the invention includes: a prescan step of executing a prescan sequence to measure a magnetic resonance signal for detecting a difference between a set value of a readout gradient magnetic field in an imaging pulse sequence and an actual output value; a correction value calculation step of calculating a correction value based on the difference using the magnetic resonance signal measured using the prescan sequence; and a correction step of correcting echo data acquired by the imaging pulse sequence or correcting the readout gradient magnetic field in the imaging pulse sequence using the correction value.

More specifically, the MRI apparatus of the invention has a prescan sequence separately from the imaging pulse sequence, and the correction value calculating unit calculates a difference between the set value of the application start time of the readout gradient magnetic field, which is set in the imaging sequence, and the application start time of the readout gradient magnetic field, which is actually applied, as a correction value using the measurement data acquired by the prescan sequence.

The correction value calculated by the correction value calculating unit is used to correct a parameter value used for gridding, for example, at the time of gridding for arraying the measurement data acquired by measurement based on the imaging pulse sequence at the k space data. In addition, the operation unit performs gridding of the measurement data acquired by the measurement based on the imaging pulse sequence using a parameter corrected by the correction value.

Alternatively, it is used to correct the application start time of the readout gradient magnetic field in the imaging pulse sequence.

The prescan sequence includes a sequence of measuring a magnetic resonance signal while applying the readout gradient magnetic field obtained by inverting the polarity of a dephasing gradient magnetic field after application of the dephasing gradient magnetic field, for example. Alternatively, the prescan sequence includes a first prescan sequence of measuring a magnetic resonance signal from the rising state of the readout gradient magnetic field without using a dephasing gradient magnetic field as a readout gradient magnetic field and a second prescan sequence of measuring a magnetic resonance signal using the dephasing gradient magnetic field.

Advantageous Effects of Invention

According to the invention, the gridding parameter is corrected using the data acquired by pre-measurement (prescan). In addition, when gridding the data acquired by main imaging, the gridding is performed using the coordinate transformation expression corrected according to the gradient magnetic field actually applied. Accordingly, it is possible to acquire an image with excellent image quality which has no image distortion, contrast change, and the like occurring due to the difference between the calculated value of the gradient magnetic field and the conditions actually applied.

In addition, according to the invention, the application start time of the readout gradient magnetic field in the main imaging pulse sequence is corrected using the correction value using the data acquired by the prescan. Accordingly, the difference between the calculated value of the gradient magnetic field and the conditions actually applied can be eliminated without performing gridding correction.

BRIEF DESCRIPTION OF DRAWINGS

FIGS. 7 (a) and (b) are views for explaining preprocessing of an echo acquired by a prescan.

DESCRIPTION OF EMBODIMENTS

Hereinafter, embodiments of the invention will be described.

Figure 1:
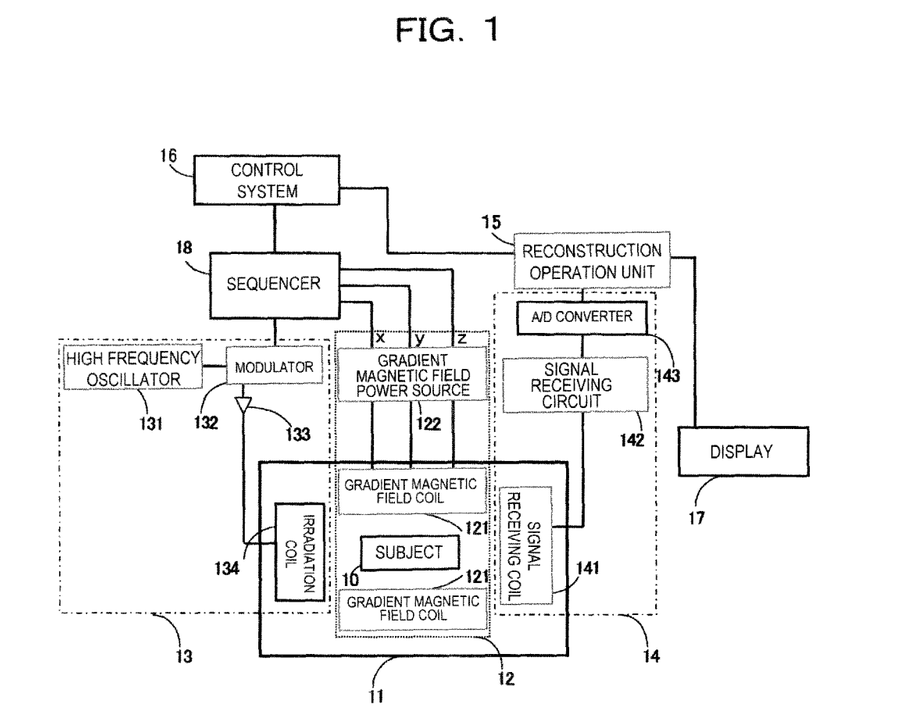
FIG. 1 is a view showing the outline of an MRI apparatus to which the invention is applied.
Figure 2:
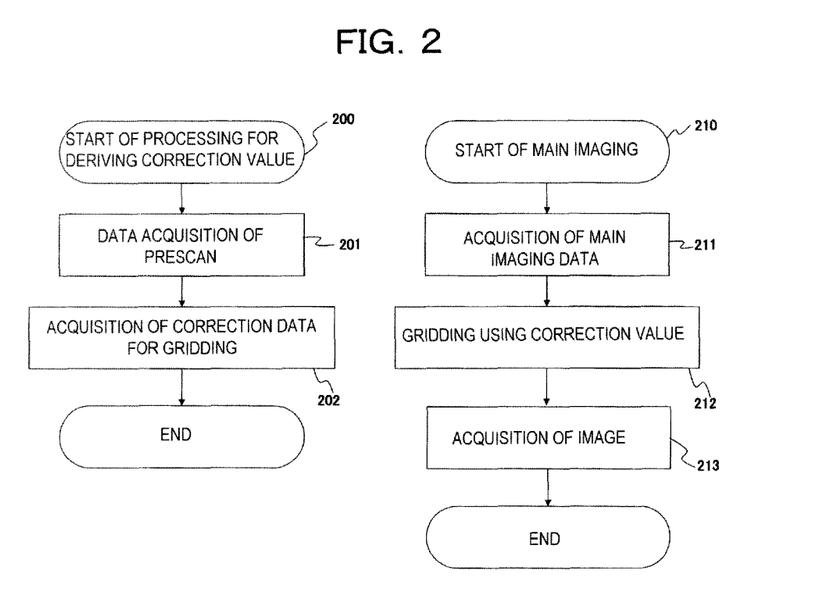
FIG. 2 is a view showing the imaging procedure using the MRI apparatus of the invention.

FIG. 1 shows the entire configuration of an MRI apparatus to which the invention is applied, and FIG. 2 shows the configuration of a controller which is a main unit for applying the invention.

As shown in FIG. 1, an MRI apparatus mainly includes: a static magnetic field generating system 11 which generates a uniform static magnetic field around a subject 10; a gradient magnetic field generating system 12 which gives a magnetic gradient in three axial directions (x, y, and z) perpendicular to the static magnetic field; a high frequency magnetic field generating system 13 which applies a high frequency magnetic field to the subject 10; a signal receiving system 14 which detects a magnetic resonance signal generated from the subject 10; a reconstruction operation unit 15 which reconstructs a tomographic image, a spectrum, or the like of the subject using the magnetic resonance signal received by the signal receiving system 14; and a control system 16 which controls operations of the gradient magnetic field generating system 12, the high frequency magnetic field generating system 13, and the signal receiving system 14.

Although not shown, a magnet, such as a permanent magnet or a superconducting magnet, is disposed in the static magnetic field generating system 11, and the subject is placed in a bore of the magnet. The gradient magnetic field generating system 12 includes gradient magnetic field coils 121 in the three axial directions and a gradient magnetic field power source 122 which drives the gradient magnetic field coils 121. The high frequency magnetic field generating system 13 includes: a high frequency oscillator 131; a modulator 132 which modulates a high frequency signal generated by the high frequency oscillator 131; a high frequency amplifier 133 which amplifies a modulated high frequency signal; and an irradiation coil 134 which receives a high frequency signal from the high frequency amplifier 133 and irradiates the subject 10 with the high frequency magnetic field pulse.

The signal receiving system 14 includes: a signal receiving coil 141 which detects a magnetic resonance signal (echo signal) from the subject 10; a signal receiving circuit 142 which receives the signal detected by the signal receiving coil 141, and an A/D converter 143 which converts an analog signal received by the signal receiving circuit 142 into a digital signal at a predetermined sampling frequency. The reconstruction operation unit 15 performs operations, such as correction calculation and the Fourier transform, on the digital signal (echo data and measurement data) output from the A/D converter 143 in order to reconstruct an image. The processing result in the reconstruction operation unit 15 is displayed on a display 17.

The control system 16 controls the operation of the entire apparatus described above and in particular, includes a sequencer 18 for controlling the operations of the gradient magnetic field generating system 12, the high frequency magnetic field generating system 13, and the signal receiving system 14 at a predetermined timing determined by an imaging method and a storage unit (not shown) which stores a parameter required for control and the like. The timing of each magnetic field pulse generation controlled by the sequencer 18 is called a pulse sequence, and various kinds of pulse sequences are stored in the storage unit in advance. By reading and executing a desired pulse sequence, imaging is performed.

The control system 16 and the reconstruction operation unit 15 include user interfaces for a user to set the conditions or the like required for their processing. Through these user interfaces, selection of an imaging method or setting of a parameter required for execution of the pulse sequence is performed.

The MRI apparatus of the invention has a UTE pulse sequence and its pre-measurement (prescan) sequence as pulse sequences. If the UTE pulse sequence is adopted as an imaging method, pre-measurement is performed to calculate a conversion parameter (correction value) required for gridding of the measurement data acquired by the UTE measurement.

First Embodiment

A first embodiment of the invention will be described on the basis of the outline of the apparatus described above. The imaging procedure according to the present embodiment is shown in FIG. 2.

As shown in the drawing, imaging of the present embodiment includes a process flow 200 of deriving a correction value and a main imaging flow 210. The correction value process flow 200 includes a data acquisition step 201 using a prescan and a step 202 of calculating a correction value for gridding using the prescan data. In addition, the main imaging flow 210 includes a data acquisition step 211 based on the main imaging, a gridding step 212 using the correction value derived in the process flow 200, and a step 213 of reconstructing an image from the k space data after gridding.

Figure 3:
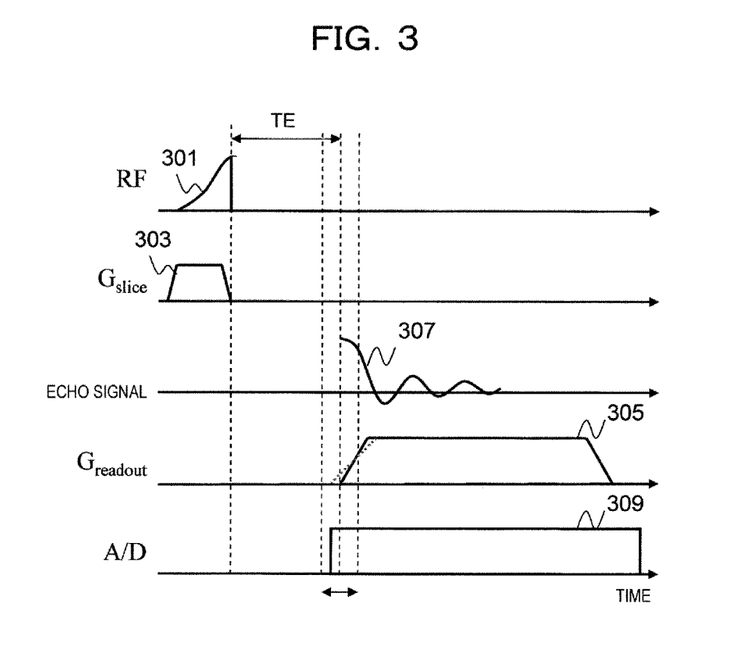
FIG. 3 is a view showing an example of the pulse sequence in main imaging.

Hereinafter, each step will be described in detail. First, the pulse sequence of UTE measurement executed in step 211 will be described. The pulse sequence of typical UTE measurement is shown in FIG. 3. As shown in the drawing, in the UTE measurement, a half-wave high frequency (RF) pulse 301 is applied together with a slice gradient magnetic field pulse 303, and then a readout gradient magnetic field pulse 305 is applied and an echo signal 307 is measured simultaneously with the application. A signal measured without applying a dephasing gradient magnetic field is an FID with no peak, and is a signal whose signal value is the maximum at the start of application of the readout gradient magnetic field pulse 305.

In the drawing, A/D 309 indicates an echo signal sampling time. In the embodiment shown in the drawing, sampling starts slightly before the rising (application start time of a gradient magnetic field set in the apparatus) of the readout gradient magnetic field. Accordingly, even if the application start time of the gradient magnetic field is shifted from the set time, sampling is possible without missing the maximum value (peak) of the echo signal.

The readout gradient magnetic field pulse 305 mixes gradient magnetic fields in two axial directions of x and y axes, for example. By repeating the same pulse sequence with different strengths of both the gradient magnetic fields, a plurality of echo signals 307 is measured. As a result, echo signals within the xy surface are acquired as the measurement data. In addition, by appropriately selecting a combination with an axis of a gradient magnetic field used as a readout gradient magnetic field pulse, it is possible to acquire a signal from any section as well as the signals within the xy surface.

The raw measurement data acquired by the UTE measurement described above is shown in (a) of FIG. 4. In the drawing, the data arrayed in one line is equivalent to a signal acquired by one measurement. As shown in the drawing, a data gap is narrow until the gradient magnetic field strength becomes constant from the start of data measurement start (left in the drawing). If they are arrayed in the k space (kx-ky space), a radial shape with the origin of the k space as its center is obtained, as shown in (b) of FIG. 4. In the gridding step 212, such radial measurement data is converted into data on the grid in the k space as shown in (c) of FIG. 4.

Figure 4:
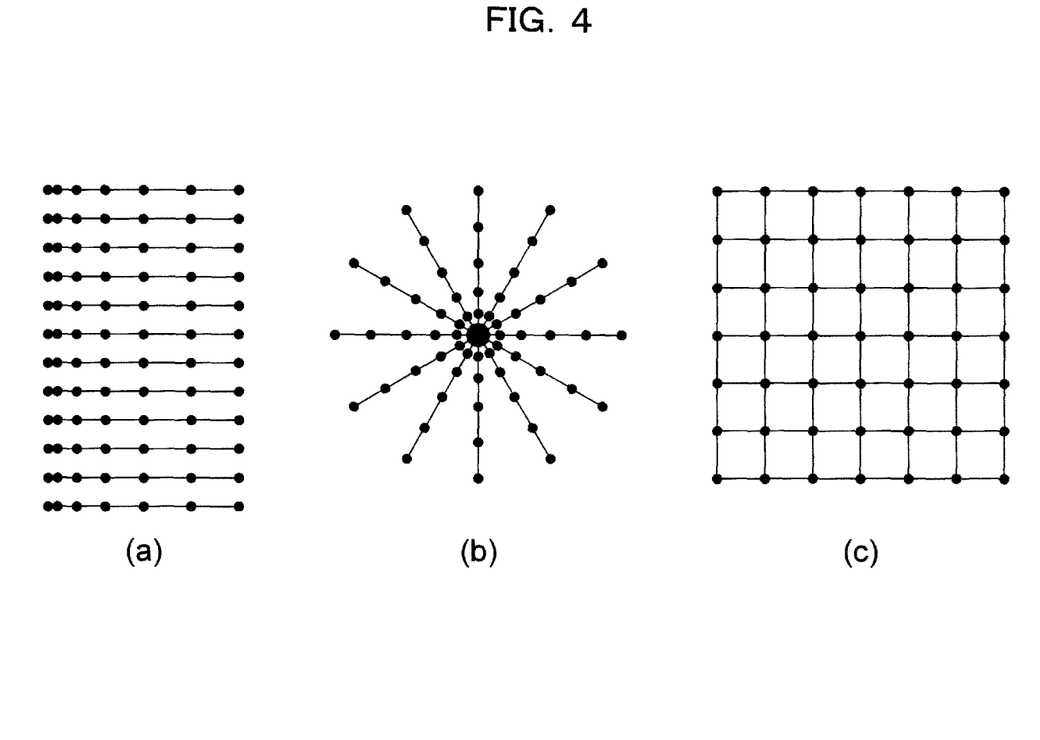
FIG. 4 is a view for explaining the measurement data acquired in FIG. 3 and its gridding.

Here, when the readout gradient magnetic field 305 shown in FIG. 3 starts at the gradient magnetic field application start time (GCdelay) set in the apparatus and the rising shape of a gradient magnetic field pulse is an ideal trapezoid, that is, when it is the same as a set value (theoretical value), the measurement data is radial data with the origin of the k space as its center as shown in (b) of FIG. 4 and the data gap is a predetermined gap determined by the amount of application (integral value for the time axis) of a gradient magnetic field which can be calculated from the trapezoidal shape. However, a gradient magnetic field pulse which is actually output from the apparatus and applied to the subject may not be linear since the application start time deviates from the calculated value or the rising slope may be smaller than the calculated value, as shown by a dotted line in FIG. 3. In such a case, it is not possible to acquire the correct k space data even if gridding based on the calculated value of a gradient magnetic field pulse is performed.

Figure 5:
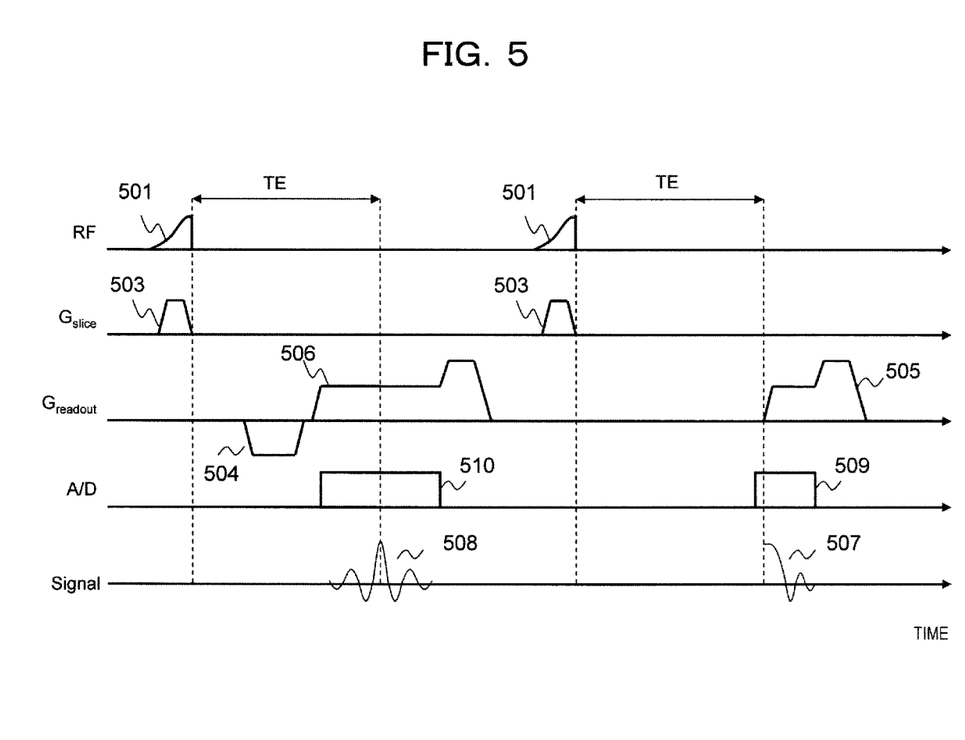
FIG. 5 is a view showing an example of the prescan sequence in the first embodiment.

The correction value process flow 200 is a processing for calculating the correction value for correcting a shift of an actual gradient magnetic field pulse from the calculated value. First, pre-measurement (prescan) is executed (step 201 in FIG. 2). An example of the pulse sequence of prescan is shown in FIG. 5. As shown in FIG. 5, the prescan includes two kinds of sequences which are a sequence, in which measurement is performed by generating a gradient echo (full echo) with a rephasing readout gradient magnetic field using a dephasing gradient magnetic field, and a sequence, in which a signal (nonlinear echo) is measured from the rising of the readout gradient magnetic field without using a dephasing gradient magnetic field.

In addition, although the same RF pulse and slice gradient magnetic field as those used in UTE measurement are used as the RF pulse 501 and the slice gradient magnetic field 503 in the example shown in FIG. 5, a general full-wave high frequency pulse, a slice gradient magnetic field, and a slice refocusing gradient magnetic field may also be used. In addition, a cross section on which the spin is excited by the RF pulse 501 and the slice gradient magnetic field 503 may be the same as that in the main imaging or may be different. For example, when the cross section imaged in the main imaging is a yz surface of the apparatus, it is possible to apply a slice gradient magnetic field which selects the xy surface of the apparatus for calculating the correction value at the x axis of the apparatus.

In the sequence of measuring a full echo, the RF pulse 501 and the slice gradient magnetic field 503 are applied and then the dephasing gradient magnetic field 504 is applied in the reading direction. Then, the echo signal 508 is measured while applying the readout gradient magnetic field 506 with the inverted polarity. A predetermined sampling time 510 is set with an echo time TE (when the amount of application of the dephasing gradient magnetic field 504 and the amount of application of the readout gradient magnetic field 506 become equal) interposed therebetween, and a signal which becomes a peak at the TE is measured.

Although the sequence of measuring a nonlinear echo is the same as the UTE pulse sequence shown in FIG. 3, the echo time TE is set in the same manner as in the full echo measurement sequence described above. The readout gradient magnetic field 506 is applied after elapse of TE from application of the RF pulse 501 and the slice gradient magnetic field 503, and a signal 507 is measured from a point in time immediately before this (sampling time 509). This signal is a signal with no peak, as shown in the drawing.

By repeating the prescan including the two kinds of sequences described above by changing the strength of the readout gradient magnetic field, a set of measurement data is acquired for each sequence. The number of echo signals included in a set of measurement data may be equal to or smaller than that in the UTE measurement which is the main measurement. It is preferable to acquire at least the data in each axial direction of the readout gradient magnetic fields of two or three axes which form a gradient magnetic field.

Figure 6:
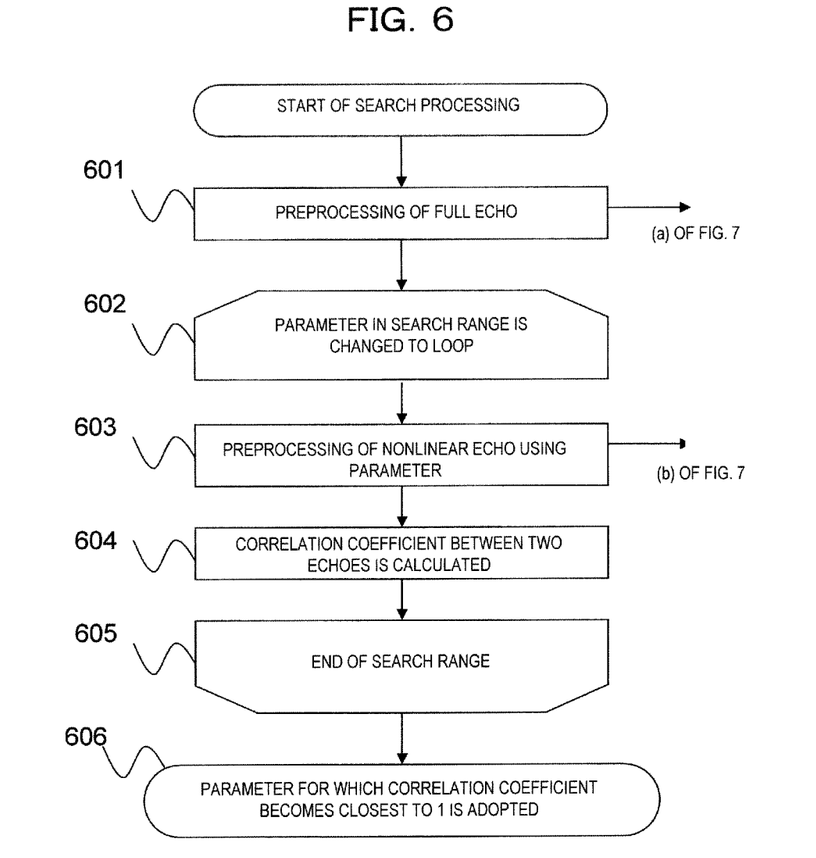
FIG. 6 is a view showing the search procedure in the first embodiment.

Then, the correction data for gridding is calculated using the measurement data acquired by the prescan (step 202 in FIG. 2). In the present embodiment, data obtained by gridding and the Fourier transform of the second half from the peak of a full echo is compared with data obtained by gridding and the Fourier transform of a nonlinear echo, and a parameter of gridding is corrected so that the data of the nonlinear echo becomes equal or closest to the data of the full echo. Details of a step of calculating the correction data for gridding are shown in FIG. 6.

The processing of calculating a correction value is a processing of performing gridding for the measured data while changing the parameter (conditions) of gridding and searching for a parameter for which the data of a full echo and the data of a nonlinear echo match best, and the parameter acquired by the search processing is equivalent to the correction value (corrected parameter). Specifically, the parameter of gridding is a value determined from an application start time and a shape of the readout gradient magnetic field. The range (search range) where the parameter of gridding is changed is set in consideration of the range of a variation predicted from the characteristics of the gradient magnetic field.

Figure 7:
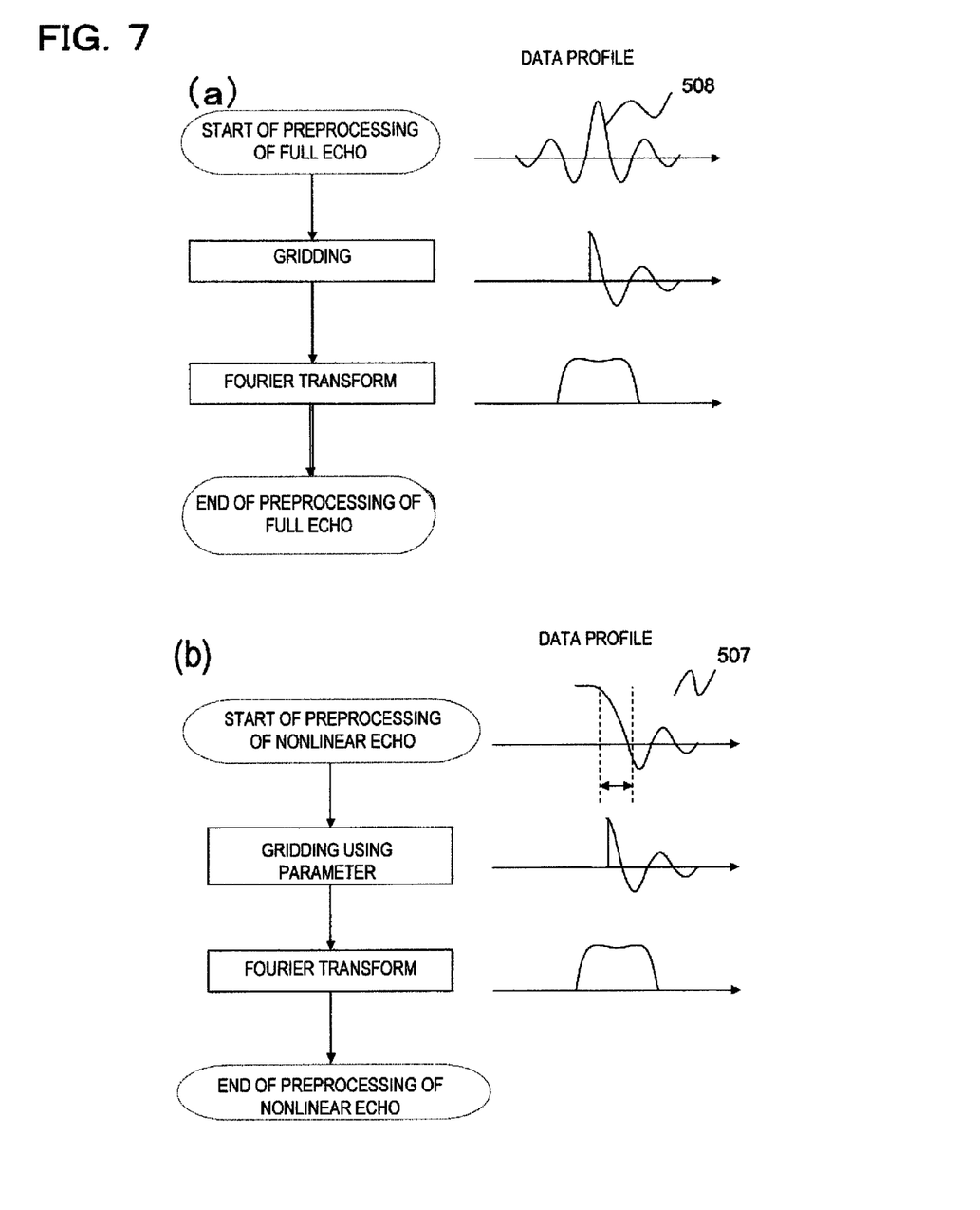

In the search processing, first, preprocessing and the Fourier transform of a full echo are performed to acquire the data (step 601). Specifically, in the preprocessing, only a second half from the peak position is extracted from the full echo acquired by the prescan and subjected to gridding, and then the Fourier transform is performed to obtain the real space data, as shown in (a) of FIG. 7. Here, in order to see the peak position of the full echo, it is preferable to use the characteristic of the following Expression (1) of the Fourier transform.

[Expression 1]

$$f[n] \xleftrightarrow[FOURIER\ TRANSFORM]{} F[k] \quad (1)$$

$$f[n + \Delta n] \xleftrightarrow[FOURIER\ TRANSFORM]{} F[k]\exp\left(\frac{2\pi i}{N}k\Delta n\right)$$

From Expression (1), a shift of the function f[n] by Δn is equivalent to multiplying F[k], which is obtained by the Fourier transform of f[n], by an exponential function exp(2πikΔn/N). Accordingly, by calculating the slope of the phase when performing the Fourier transform of the data with a peak of the full echo, the relative positional relationship between the center of the data and the peak position can be seen. Gridding is performed with this peak position as the origin of the coordinates. Since the full echo is the data measured when the readout gradient magnetic field is constant, the data processed as described above does not include an error depending on a shift of the application start time or the rising shape of the gradient magnetic field from the calculated value (set value).

Then, preprocessing of the nonlinear echo is performed (step 603). As shown in (b) of FIG. 7, this processing is the same as the preprocessing of the full echo. Gridding is performed and then the Fourier transform of the k space data is performed to obtain the real space data. In this case, as an initial value of the parameter of gridding, for example, the coordinates of the measurement data are calculated on the assumption that the shape of the readout gradient magnetic field is a trapezoid with a height of 1 and that the application start time of the gradient magnetic field matches the peak of the echo. In the case of performing processing on a plurality of echoes in a sequential manner, a result acquired in preprocessing may be set as an initial value. Specifically, if the strength of the gradient magnetic field when acquiring the n-th data is expressed by the following Expression (2), the coordinate expression at that time is expressed by Expression (3).

Expression (2): gradient magnetic field shape $$\begin{array}{ll} 0 & n < n_{peak} \quad \text{[Expression 2]} \\ G\dfrac{1}{N_{nonlinear}}(n - n_{peak}) & n_{peak} \leq n < N_{nonlinear} + n_{peak} \\ G & N_{nonlinear} + n_{peak} \leq n \end{array}$$

Expression (3): k space coordinates of measurement data $$\begin{array}{ll} 0 & n < n_{peak} \quad \text{[Expression 3]} \\ \dfrac{1}{2N_{nonlinear}}(n - n_{peak})^2 & n_{peak} \leq n < N_{nonlinear} + n_{peak} \\ n - n_{peak} - N_{nonlinear}/2 & N_{nonlinear} + n_{peak} \leq n \end{array}$$

Figure 8:
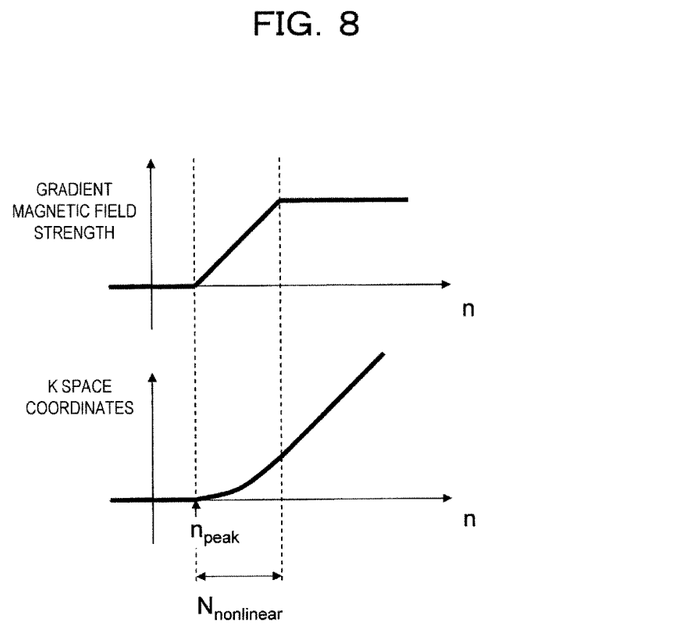
FIG. 8 is a view showing the relationship between the gradient magnetic field strength at the rising and the k space coordinates of the data measured at the rising.

In these Expressions, $N_{nonlinear}$, $n_{peak}$, and G correspond to the number of points (the number of nonlinear measured points) measured in a rising period of the gradient magnetic field, a peak position (application start time), and the strength of an applied gradient magnetic field, respectively. The gradient magnetic field strength and the coordinates of the n-th data calculated from the above Expressions are shown in FIG. 8.

Then, the real space data obtained by gridding and then the Fourier transform of the nonlinear echo is compared with the real space data of the full echo calculated in step 601. Specifically, a correlation coefficient of both data items is calculated (step 604). For the calculation of the correlation coefficient, only an absolute value of the real space data may be used or a complex number may be used.

Then, the parameter of gridding of the nonlinear echo is changed to repeat steps 603 and 604. Specifically, a correlation coefficient is calculated by changing the application start time of the gradient magnetic field in a predetermined range. Changing of the application start time is equivalent to changing of the value of $n_{peak}$ in Expression (2). Alternatively, a correlation coefficient is calculated by changing the slope of the gradient magnetic field in a predetermined range. Changing of the slope of the gradient magnetic field is equivalent to changing of the number of $N_{nonlinear}$ in Expression (2).

The real space data obtained by performing gridding while changing the parameter in a predetermined search range in this way and performing the Fourier transform of the gridding result is compared with the real space data acquired from the full echo (steps 602 to 605). Finally, a parameter for which the correlation coefficient becomes closest to 1 within the search range (for example, the gradient magnetic field application start time $n_{peak}$ or the number of data points $N_{nonlinear}$) is selected (step 606). Alternatively, it is also possible to set a threshold value of a correlation coefficient in advance as conditions of the end of search and to select a parameter when the correlation coefficient becomes equal to or smaller than the threshold value.

This is the processing for calculating a correction value. It is ideal to perform such correction value calculation for all echoes (all items of the radial data shown in (b) of FIG. 4) of the measurement data in the main imaging. In practice, however, since it is thought that a change in the correction values of adjacent echoes is small, it is preferable to calculate a correction value for each item of the data of a predetermined angle. That is, in the prescan, the number of echoes may be thinned out for measurement instead of measuring echoes the number of which is the same as the number of echoes of the measurement data in the main measurement. Alternatively, since the characteristics of the gradient magnetic field of one axis are fixed, it is also possible to calculate the correction value only for the directions of two axes if the measurement data is two-dimensional k space data and calculate the correction value only for the directions of three axes if the measurement data is three-dimensional k space data. For other data, it is possible to interpolate the correction values or to mix the correction values at the rate corresponding to the rate of the gradient magnetic field strength and set the result as a correction value.

If the correction value is calculated from the measurement data obtained by the prescan in this way, gridding of the measurement data based on the UTE measurement which is the main imaging is performed using the correction value (gridding step 212 in FIG. 2). That is, using Expression (3) corrected with the correction value $n_{peak}$ as a coordinate calculation expression at the time of gridding, the k space coordinates of measurement data are calculated first, and the value of the data on the grid of the k space at the time of gridding is determined from the k space coordinates. The determination method of determining the value of the data on the grid is the same as a general gridding method. For example, weighting addition of data which is present at a predetermined distance from one grid point is performed according to the distance and the result is set as a value of the grid point. This is performed for all grid points of the k space to acquire the k space data. Finally, the Fourier transform of the k space data after gridding is performed to reconstruct an image (image reconstruction step 213 in FIG. 2).

An example of specific coordinate calculation when calculating a correction value for the x, y, and z axes of the apparatus is shown below. In this case, the coordinates of the n-th data point of an echo in a θ direction of an image is expressed by the following Expression (4).

[Expression 4]

$$\begin{pmatrix} s \\ p \\ f \end{pmatrix} = \begin{pmatrix} s_x & s_y & s_z \\ p_x & p_y & p_z \\ f_x & f_y & f_z \end{pmatrix} \begin{pmatrix} (f_x\cos\theta + p_x\sin\theta)(n - n_{peakX})^2 / 2N_{nonlinearX} \\ (f_y\cos\theta + p_y\sin\theta)(n - n_{peakY})^2 / 2N_{nonlinearY} \\ (f_z\cos\theta + p_z\sin\theta)(n - n_{peakZ})^2 / 2N_{nonlinearZ} \end{pmatrix} \quad (4)$$

Here, s, p, and f indicate coordinates of an image, to which data point corresponds, in the depth, vertical, and horizontal directions, respectively. $s_x$, $s_y$, $s_z$, $p_x$, $p_y$, $p_z$, $f_x$, $f_y$, and $f_z$ indicate elements of a matrix for transformation from the xyz coordinate system of an apparatus to the spf coordinate system of an image. $n_{peakX}$, $n_{peakY}$, and $n_{peakZ}$ indicate peak coordinates at each axis, and $N_{nonlinearX}$, $N_{nonlinearY}$, and $N_{nonlinearZ}$ indicate the number of points nonlinear-measured at each axis. By gridding the values of p and f among them as the coordinates of data on the image, the data can be arrayed at the grid points of the k space.

Thus, according to the present embodiment, a prescan including two kinds of pulse sequences of full echo measurement and nonlinear measurement is executed, a correction value for performing gridding of the nonlinear measurement so that a correlation coefficient with two kinds of data obtained by the prescan becomes closest to 1 is calculated, and this is applied to gridding of the measurement data. As a result, since an error of gridding caused by a shift of the gradient magnetic field application start time from the calculated value, a shift of the gradient magnetic field shape from the calculated value, and the like can be eliminated, a UTE image with good image quality can be acquired.

First Modification of the First Embodiment

In the first embodiment, the case of performing search processing on the assumption that the shape of the gradient magnetic field is a trapezoid has been described. In the case where the rising of the gradient magnetic field is not a straight line, the search processing may be similarly performed using an Expression (Expression (5) shown below) approximated by the trigonometric function, for example, instead of Expression (1) indicating the shape of the gradient magnetic field. The coordinate calculation expression in that case is shown in Expression (6).

Expression (5): gradient magnetic field shape $$\begin{cases} 0 & n < n_{peak} \\ \frac{G}{2}\left[1 - \cos\frac{\pi}{N_{nonlinear}}(n - n_{peak})\right] & n_{peak} \leq n < N_{nonlinear} + n_{peak} \\ G & N_{nonlinear} + n_{peak} \leq n \end{cases}$$ [Expression 5]

Expression (6): k space coordinates of measurement data $$\frac{1}{2}\begin{bmatrix} 0 & n < n_{peak} \\ (n - n_{peak}) - \frac{N_{nonlinear}}{\pi}\sin\frac{\pi}{N_{nonlinear}}\left(\begin{matrix}n - \\ n_{peak}\end{matrix}\right) & n_{peak} \leq n < N_{nonlinear} + n_{peak} \\ n - n_{peak} - N_{nonlinear}/2 & N_{nonlinear} + n_{peak} \leq n \end{bmatrix}$$ [Expression 6]

In Expressions (4) and (5), $N_{nonlinear}$ indicates the number of nonlinear-measured points, and $n_{peak}$ indicates a peak position. Also in this case, it is possible to fix $N_{nonlinear}$ and change only the peak position, or it is possible to change $N_{nonlinear}$.

Second Modification of the First Embodiment

The processing of calculating the correction value of a parameter of gridding may be performed as multi-stage processing, such as two-stage or three-stage processing, by changing the type of a parameter or the change density when a parameter is changed. The procedure in the case of search using two-stage processing is shown in FIG. 9.

Figure 9:
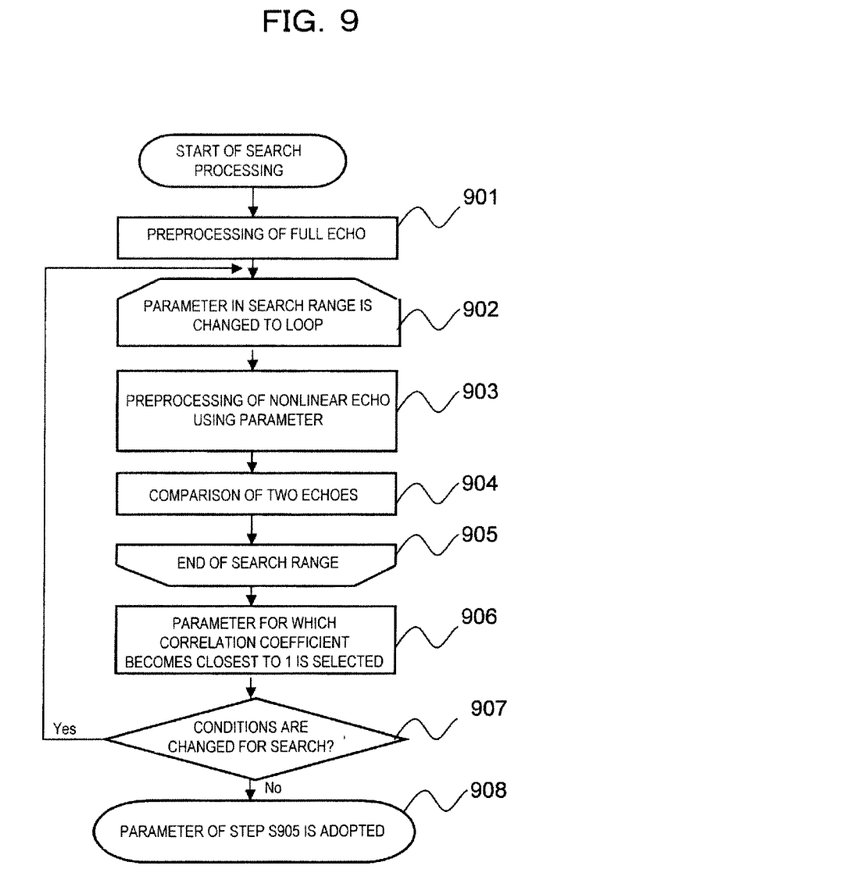
FIG. 9 is a view showing the search procedure in a modification of the first embodiment.

In the search procedure shown in FIG. 9, steps 901 to 905 are the same as steps 601 to 605 shown in FIG. 6. In this modification, however, for example, in the first loop 902 to 905, a search is performed with a large parameter change width, that is, a rough search is performed. For example, if a parameter for which the correlation coefficient becomes closest to 1 is selected by a rough search of several points (step 906), this parameter is then set as an initial value (step 907) and a detailed search is performed while changing parameters in the neighborhood, and a parameter for which the correlation coefficient becomes closest to 1 is selected among them (step 908). Thus, by combination of the rough search and the detailed search, a parameter correction value can be calculated by a small amount of search processing.

Alternatively, in the first loop 902 to 905, a search is performed while changing only one of the plurality of parameters, for example, only a parameter regarding the gradient magnetic field application start time, and a parameter which brings a correlation coefficient closest to 1 in the search range is selected (step 906). Then, the parameter is changed to change the number of points N, for example (step 907), and the next search loop 902 to 905 is executed. Also in this case, it is possible to shorten the time of search processing similarly to the multi-stage processing in which the search density is changed. In addition, multi-stage processing in which the search density is changed and multi-stage processing in which the parameter type is changed may be appropriately combined.

Other Modifications of the First Embodiment

In the embodiment described above, a correlation coefficient was calculated to compare the data acquired by full echo measurement with the data acquired by nonlinear measurement. However, it is also possible to calculate the square sum of the difference of both the data items and calculate a parameter for which the square sum becomes a minimum, instead of calculating the correlation coefficient.

In addition, although the case where the real space data acquired by full echo measurement is compared with the real space data acquired by nonlinear measurement is described in the above embodiment, the k space data before the Fourier transform may be compared.

Second Embodiment

Also in the present embodiment, pre-measurement is performed separately from the main imaging as in the first embodiment and its modification. In the present embodiment, however, only full echo measurement is performed and nonlinear measurement is not performed in the pre-measurement. The full echo measurement is the same as the first half of the pulse sequence shown in FIG. 5. The RF pulse 501 and the slice gradient magnetic field 503 are applied and then the dephasing gradient magnetic field 504 is applied in the reading direction. Then, the echo signal 508 is measured while applying the readout gradient magnetic field 506 with the inverted polarity.

Figure 10:
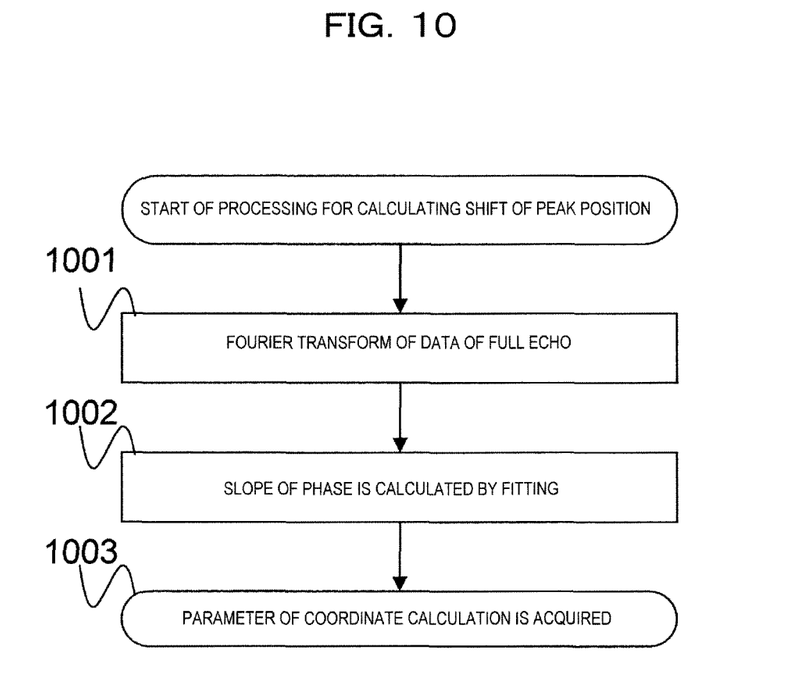
FIG. 10 is a view showing the correction value calculation procedure in a second embodiment.

The procedure of processing for calculating a shift of the peak position is shown in FIG. 10. Here, the shift of the peak position of a full echo can be calculated by the characteristic of the Fourier transform shown in Expression (1). That is, the Fourier transform of a full echo acquired by pre-measurement is performed first (step 1001), and the slope of the phase after the Fourier transform is calculated by fitting (step 1002). A shift Δn of the peak position is calculated from the slope of the phase (step 1003). When the peaks in the full echo and the nonlinear echo are shifted in the same direction, this shift Δn can be applied for correction of the peak position (gradient magnetic field application start time) $n_{peak}$ shown in Expression (3) or Expression (6).

In the present embodiment, only full echo measurement is performed as the pre-measurement and the operation of calculating the correlation coefficient between the data acquired by full echo measurement and the data acquired by nonlinear measurement is not necessary. Accordingly, there is an advantage that a parameter of gridding can be simply calculated.

Modifications of the First and Second Embodiments

In the first and second embodiments, the pulse sequence of measuring one signal after one RF excitation was exemplified as the UTE pulse sequence and the prescan sequence. However, the UTE pulse sequence may be a multi-echo sequence in which a plurality of echoes is measured after one RF excitation, for example. In that case, the correction value (conversion parameter) of gridding may be calculated for each echo with a prescan as a multi-echo sequence, and gridding of each echo of the UTE pulse sequence which is the main imaging may be performed using the correction value calculated for an echo to which TE of the prescan corresponds. Alternatively, the prescan may be performed with the number of echoes (for example, one echo) smaller than the UTE pulse sequence, and the correction value (the same conversion parameter) of gridding calculated for the prescan echo may be applied to a plurality of or all echoes of UTE measurement.

Third Embodiment

In the above two embodiments, the case of correcting a gridding parameter of the data measured by main imaging was described using the correction value calculated by the prescan. In the present embodiment, however, the data acquired by the main imaging is not corrected but the pulse sequence of the main imaging is corrected.

The present embodiment is the same as the first and second embodiments in that the application start time of the gradient magnetic field is calculated as a correction value by performing the preprocessing 200 shown in FIG. 2. In the present embodiment, the pulse sequence of main imaging made by the sequence using a correction value (application start time of the gradient magnetic field) is modified to shift the application start time of the readout gradient magnetic field, so that the data acquisition start time (left end of 309 in FIG. 3) and the application start time (left end of 305 in FIG. 3) of the readout gradient magnetic field match each other. As a result, when reconstructing the data acquired by main imaging by gridding, the gridding can be performed without performing the correcting step 212 in FIG. 2.

According to the present embodiment, an effect that the reconstruction processing of calculating the coordinates for gridding is simplified is obtained in addition to the effect that a shift of the data point acquired by the main imaging in the k space is eliminated.

While the embodiments of the invention have been described, the invention is not limited to the above-described embodiments and various modifications may be made. For example, although the UTE pulse sequence is described as an example of the main imaging in each embodiment described above, the invention may also be applied to pulse sequences other than the UTE pulse sequence. For example, the invention may be applied to radial scan using a full-wave high frequency pulse as an RF pulse instead of a half-wave type high frequency pulse. In addition, three-dimensional measurement of collecting the data of kx-ky-kz may be applied instead of the two-dimensional measurement of collecting kx-ky space data.

REFERENCE SIGNS LIST

11: static magnetic field generating system
12: gradient magnetic field generating system
  13: high frequency magnetic field generating system
  14: signal receiving system
  15: reconstruction operation unit
  16: control system
  17: display
  18: sequencer

The invention claimed is:
1. A magnetic resonance imaging apparatus comprising:
a high frequency magnetic field generator;
a gradient magnetic field generator; and
a controller which controls measurement of a magnetic resonance signal by controlling the high frequency magnetic field generator and the gradient magnetic field generator,
wherein the controller has an imaging pulse sequence of measuring the magnetic resonance signal from a rising state of a readout gradient magnetic field and includes a correction value calculating unit that calculates a correction value based on a difference between a set value of a rising waveform of the readout gradient magnetic field in the imaging pulse sequence and an actual output value thereof.
2. The magnetic resonance imaging apparatus according to claim 1,
wherein the controller has a prescan sequence of measuring a magnetic resonance signal for detecting the difference, and
the correction value calculating unit calculates the correction value using a magnetic resonance signal measured using the prescan sequence.
3. The magnetic resonance imaging apparatus according to claim 2, further comprising:
an operation unit that performs gridding of the echo data acquired by the imaging pulse sequence at grid points of a K space,
wherein the operation unit corrects a position on the K space of the echo data acquired by the imaging pulse sequence using the correction value and performs gridding of the echo data whose position on the K space has been corrected at grid points of the K space.
4. The magnetic resonance imaging apparatus according to claim 3,
wherein the prescan sequence includes a first prescan sequence of acquiring full echo data and a second prescan sequence of acquiring nonlinear echo data, and
the correction value calculating unit calculates the correction value on the basis of some of the full echo data and the nonlinear echo data.
5. The magnetic resonance imaging apparatus according to claim 4,
wherein in the first prescan sequence, the full echo data is acquired using a dephasing gradient magnetic field as a readout gradient magnetic field, and
in the second prescan sequence, the nonlinear echo data is acquired from the rising state of the readout gradient magnetic field without using the dephasing gradient magnetic field as a readout gradient magnetic field.
6. The magnetic resonance imaging apparatus according to claim 4,
wherein the correction value calculating unit calculates a parameter value used for the gridding, as the correction value, on the basis of comparison between the second half of the full echo data and the nonlinear echo data, and
the operation unit corrects the position on the K space of the echo data acquired by the imaging pulse sequence using the parameter value used for the gridding.
7. The magnetic resonance imaging apparatus according to claim 6,
wherein the correction value calculating unit calculates a correlation coefficient between first real space data, which is obtained by performing gridding and then the Fourier transform of data after the peak position in the full echo data, and second real space data, which is obtained by performing gridding and then the Fourier transform of the nonlinear echo data, repeats the calculation of the correlation coefficient while changing a parameter used for gridding of the echo data acquired by one prescan sequence, and sets a parameter value, which gives a value closest to 1 as the correlation coefficient, as the parameter value used for gridding of the echo data acquired by the imaging pulse sequence.
8. The magnetic resonance imaging apparatus according to claim 6,
wherein the parameter value used for the gridding includes a value corresponding to the number of measured points of the nonlinear echo data and a value corresponding to an application start time of the readout gradient magnetic field.
9. The magnetic resonance imaging apparatus according to claim 3, wherein the controller executes the prescan sequence in each of a plurality of directions, the correction value calculating unit calculates the correction value for each direction, and the operation unit corrects the position on the K space of the echo data acquired by the imaging pulse sequence using the correction value for each direction.

10. The magnetic resonance imaging apparatus according to claim 3, wherein the imaging pulse sequence is a multi-echo sequence of acquiring a plurality of echo data after one RF excitation, and the operation unit performs gridding of a plurality of echo data acquired by one RF excitation by applying the same correction value.

11. The magnetic resonance imaging apparatus according to claim 1, wherein the imaging pulse sequence is a pulse sequence using a half-wave pulse as a high frequency excitation pulse.

12. The magnetic resonance imaging apparatus according to claim 1, wherein the imaging pulse sequence is a pulse sequence of scanning a K space radially.

13. The magnetic resonance imaging apparatus according to claim 2, wherein in the prescan sequence, the polarity of the readout gradient magnetic field is inverted to measure a magnetic resonance signal, and the correction value calculating unit calculates the correction value on the basis of a difference between the peak position of the measured magnetic resonance signal and the peak position of a magnetic resonance signal calculated from application conditions of the readout gradient magnetic field.

14. The magnetic resonance imaging apparatus according to claim 1, wherein the controller corrects an application start time of the readout gradient magnetic field in the imaging pulse sequence on the basis of the correction value.

15. A readout gradient magnetic field error correcting method in an imaging pulse sequence of measuring a magnetic resonance signal from a rising state of a readout gradient magnetic field, comprising:

a prescan step of executing a prescan sequence to measure a magnetic resonance signal for detecting a difference between a set value of a rising waveform of the readout gradient magnetic field in the imaging pulse sequence and an actual output value thereof;

a correction value calculation step of calculating a correction value based on the difference using the magnetic resonance signal measured using the prescan sequence; and a correction step of correcting echo data acquired by the imaging pulse sequence or correcting the readout gradient magnetic field in the imaging pulse sequence using the correction value.

16. The readout gradient magnetic field error correcting method according to claim 15, further comprising:

a gridding step of performing gridding of the echo data acquired by the imaging pulse sequence at grid points of a K space, wherein in the gridding step, as the correction step, a position on the K space of the echo data acquired by the imaging pulse sequence is corrected using the correction value and gridding of echo data whose position on the K space has been corrected is performed at the grid points.

17. The readout gradient magnetic field error correcting method according to claim 16, wherein in the prescan step, acquisition of full echo data and acquisition of nonlinear echo data are performed, in the correction value calculation step, a parameter value used for the gridding is calculated as the correction value on the basis of comparison between the second half of the full echo data and the nonlinear echo data, and in the gridding step, the position on the K space of the echo data acquired by the imaging pulse sequence is corrected using the parameter value used for the gridding.

18. The readout gradient magnetic field error correcting method according to claim 15, wherein in the correction value calculation step, the correction value is calculated on the basis of a difference between the peak position of the echo data acquired by the prescan sequence and the peak position of echo data calculated from application conditions of the readout gradient magnetic field.

19. The readout gradient magnetic field error correcting method according to claim 15, wherein in the correction step, an application start time of the readout gradient magnetic field in the imaging pulse sequence is corrected on the basis of the correction value.

* * * * *